(12) United States Patent
Feudel et al.

(10) Patent No.: US 7,625,802 B2
(45) Date of Patent: Dec. 1, 2009

(54) SEMICONDUCTOR DEVICE HAVING IMPROVED HALO STRUCTURES AND A METHOD OF FORMING THE HALO STRUCTURES OF A SEMICONDUCTOR DEVICE

(75) Inventors: Thomas Feudel, Radebeul (DE); Manfred Horstmann, Dresden (DE); Rolf Stephan, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 1596 days.

(21) Appl. No.: 10/400,226

(22) Filed: Mar. 27, 2003

(65) Prior Publication Data

US 2004/0063262 A1 Apr. 1, 2004

(30) Foreign Application Priority Data

Sep. 30, 2002 (DE) ................................ 102 45 608

(51) Int. Cl.
*H01L 21/336* (2006.01)
(52) U.S. Cl. ................................ 438/302; 257/E21.411
(58) Field of Classification Search ................ 438/302, 438/305, 514
See application file for complete search history.

(56) References Cited

U.S. PATENT DOCUMENTS

| | | | | |
|---|---|---|---|---|
| 5,504,023 A | 4/1996 | Hong | ........................... | 437/44 |
| 5,543,337 A * | 8/1996 | Yeh et al. | ..................... | 438/302 |
| 5,705,410 A | 1/1998 | Geugan | ........................ | 437/35 |
| 5,904,551 A * | 5/1999 | Aronowitz et al. | .......... | 438/514 |
| 5,963,811 A | 10/1999 | Chern | ......................... | 438/289 |
| 5,976,937 A | 11/1999 | Rodder et al. | ................ | 438/275 |
| 6,020,244 A | 2/2000 | Thompson et al. | .......... | 438/302 |
| 6,083,794 A | 7/2000 | Hook et al. | .................. | 438/286 |
| 6,323,095 B1 | 11/2001 | Michael et al. | ............. | 438/305 |
| 6,372,587 B1 | 4/2002 | Cheek et al. | ................. | 438/302 |
| 6,426,262 B1 | 7/2002 | Fuselier et al. | .............. | 438/276 |
| 6,593,799 B2 * | 7/2003 | De et al. | ..................... | 327/534 |

FOREIGN PATENT DOCUMENTS

| | | |
|---|---|---|
| DE | 3100289 A1 | 12/1981 |
| EP | 0 535 917 A2 | 4/1993 |
| JP | 015129217 A | 5/1993 |

OTHER PUBLICATIONS

Stanley Wolf Silicon Processing for the VSLI Era, vol. 1, Lattice Press 1986, pp. 281-282.*
Translation of Official Communication from related German Patent Application No. 102 45 608.9 dated Sep. 1, 2009.

* cited by examiner

*Primary Examiner*—David S Blum
(74) *Attorney, Agent, or Firm*—Williams, Morgan & Amerson, P.C.

(57) ABSTRACT

A method of forming the halo structures of a field effect transistor is disclosed. The halo structures are formed by implanting ions of a dopant material into the substrate on which the transistor is to be formed, wherein the tilt angle of the ion beam with respect to the surface of the substrate is varied according to a predefined time schedule comprising a plurality of implanting periods.

9 Claims, 4 Drawing Sheets

SEMICONDUCTOR DEVICE HAVING IMPROVED HALO STRUCTURES AND A METHOD OF FORMING THE HALO STRUCTURES OF A SEMICONDUCTOR DEVICE

BACKGROUND OF THE INVENTION

1. Field of the Invention

The present invention relates to the fabrication of integrated circuits, and, more particularly, to implanting ions of dopant materials into workpieces and/or substrates suitable for the fabrication of integrated circuits as are employed, for example, in the formation of so-called "halo" structures of field effect transistors.

2. Description of the Related Art

In the last several years, the numbers of circuit elements manufacturable on semiconductor substrates has continuously grown. For example, in modern integrated circuit devices, there may be approximately one billion elements per chip due to the continuing miniaturization of feature sizes. Presently, circuit elements are commonly fabricated featuring minimum sizes less than 0.18 µm and the progress in the manufacturing technology seems likely to continue to proceed in this manner.

In the particular case of field effect transistors, the increasing density of the transistors manufacturable on a substrate, together with a corresponding miniaturization of the transistors, results in a reduced channel length and width. However, as process technology improved to the point where devices could be fabricated with a gate length less than 2 µm, it turned out that MOSFETs began to exhibit phenomena not predicted by the MOSFET models. Such phenomena are termed short-channel effects and have a severe influence on, among others, transistor characteristics, such as threshold voltage, drain-induced-barrier-lowering, sub-surface punch-through in NMOSFETS and punch-through in PMOSFETS.

Of these short-channel effects, punch-through in MOSFETs revealed to be the one that most affects the reliability of MOSFETs. Punch-through is a phenomenon associated with the merging of the source and drain depletion regions in the MOSFET. That is, for a constant channel-region doping, as the channel gets shorter, the distance between the depletion region edges is reduced. When the channel length is decreased to roughly the sum of the two junction depletion widths, a punch-through condition is established. Once punch-through occurs, any further increase in the applied reverse-bias drain voltage will lower the potential energy barrier for majority carriers in the source. With a diminished barrier height, a larger number of majority carriers in the source region have enough energy to be injected from the source to the substrate. Some of these injected electrons are collected by the drain, causing the sub-threshold drain current to increase. The component of the sub-threshold drain current that flows as a result of punch-through is known as punch-through current.

Great efforts have been made and several measures have been taken to prevent short-channel MOSFETs from entering the punch-through regime. Among these measures, implanting dopants under the source/drain extension (SDE) regions proved to be the most reliable and became the most likely used technique for preventing punch-through behavior in field effect transistors. Such implants have been termed "halo" implants.

In the following, a description will be given with reference to FIGS. 1a-1c of a typical prior art process for forming the source and drain regions of a field effect transistor, including a typical "halo" implanting step.

FIG. 1a schematically shows a MOS transistor 100 to be formed on a substrate 1, such as a silicon wafer. Isolation structures 2 define an active region of the transistor 100. Moreover, reference 3 relates to a polysilicon gate electrode of the MOS transistor 100. Reference 6 denotes a gate insulation layer. Finally, references 5'S and 5'D relate to source/drain extensions of the source and drain regions of the MOS transistor 100.

FIG. 1b shows the MOS transistor 100 once halo regions 5h have been formed during a prior art halo implantation step. In particular, in FIG. 1b, references 7a and 7b relate to corresponding angled ion implantation processes to which the substrate 1 is exposed for forming the halo regions 5h. The dopant material implanted during such a process is of the same type as the dopant used in doping the substrate. That is, the halo implants for NMOS and PMOS devices are performed using a P-type and an N-type, respectively, dopant material. In a sense, the halo implants reinforce the dopants in the substrate.

In FIG. 1c, reference 4 relates to dielectric sidewall spacers formed on the sidewalls of the polysilicon line 3 and references 5S and 5D relate to the source and drain regions, respectively, after a further heavy implantation step has been carried out for determining the final concentration of dopants in the source and drain regions.

A typical process flow for forming the transistor 100 as shown in FIG. 1a may include the following steps. Following the formation of the gate insulation layer 6 and the overlying polysilicon line 3 according to well-known lithography techniques, a first ion implantation step is carried out for forming the source/drain extension regions 5'S and 5'D. To this end, a dose of approximately $3\times10^{13}$ to $3\times10^{14}$ cm$^{-2}$ dopant ions is implanted at low energy (30-50 keV). The implantation process causes the edges of these implanted regions to be substantially aligned with the edge of the gate, i.e., this is a self-aligned process. This first ion implantation step is performed with N-type and P-type dopant materials for NMOS and PMOS devices, respectively.

In a next step, as depicted in FIG. 1b, the halo structures 5h are formed. To this end, a further ion implantation step is carried out during which the substrate 1 is exposed to the ion beams 7a and 7b. This halo implant is also self-aligned with the channel edge and dopants are placed beneath those dopants implanted into the SDE regions. As depicted in FIG. 1b, during halo implants, the ion beams 7a and 7b are kept at a tilt angle of approximately 30° with respect to the surface of the substrate 1. In particular, the implanting step is divided into two parts. During the first part, the substrate is exposed to the ion beam 7a and a dose corresponding to one-half of the final dose is implanted. Once the first part is completed, the substrate is rotated 180° about an axis perpendicular to the surface of the substrate and exposed again to the ion beam. In FIG. 1b, two ion beams 7a and 7b have been depicted for reason of clarity; however, the ion beam 7b during the second part corresponds to the ion beam 7a during the first part, with the only difference being that the substrate 1 is rotated 180° once the first part of the implanting step is completed.

The dopant concentration in the regions 5h, as well as the implant energy and the dopants, are selected depending on the type of transistor to be formed on the substrate 1. For instance, boron ions in NMOS and phosphorus in PMOS are implanted to form a halo punch-through suppression region in each device. Usually, phosphorous is implanted at 90 keV with a dose of $2\times10^{13}$ cm$^{-2}$ at 25° tilt, in two segments, with the substrate rotated 180° between two segments. Similar procedures are used for implanting boron. A thermal treatment, such as an annealing step, is performed after the ion implantation step for diffusing the dopants into the substrate.

The source and drain regions 5S and 5D of the transistor 100 are then completed during a subsequent step, as depicted in FIG. 1c. In particular, dielectric sidewall spacers 4 are formed on the sidewalls of the polysilicon line 3 according to well-known techniques and a further heavy implantation step is carried out for implanting dopants into those regions of the substrate not covered by the polysilicon line 3 and the sidewall spacers 4. At the end of the heavy implantation step, the source and drain regions 5S and 5D are formed to exhibit the dopant concentration profile depicted in FIG. 1c. For NMOS and PMOS type devices, this heavy implantation step is performed using an N-type and a P-type dopant material, respectively. The manufacturing process is then continued to complete the transistor 100 according to techniques well known to those skilled in the art.

The halo regions 5h allow for the prevention or at least the reduction of the punch-through effect in the transistor 100. However, the dopant concentration in the halo regions 5h, as shown in FIG. 1c, may not be appropriate to adequately prevent or minimize other short-channel effects. For instance, the vertical source/drain extension penetration depth may not be effectively controlled and/or managed adequately, and undesired parasitic substrate currents may arise due to the lower doping in the region of the highest electric field, typically located at the tips 5T of the SDE regions 5'S and 5'D.

Accordingly, in view of the problems explained above, it would be desirable to provide a technique that may solve or reduce one or more of the problems identified above. In particular, it would be desirable to provide a technique that allows the prevention and/or reduction not only of punch-through but of other short-channel effects as well.

SUMMARY OF THE INVENTION

In general, the present invention is based on the consideration that halo structures may be realized, allowing the prevention not only of punch-through but also of other short-channel effects, if the halo structures are realized by performing an ion implantation step during which the tilt angle is varied. For example, by dividing the implantation step into several periods and/or segments, and by choosing a non-constant timing for the different periods at different implant angles of the implant step, each device region receives its optimum dopant quantity to suppress and/or minimize the short-channel effect which usually arises in the region.

According to one embodiment, the present invention relates to a method of implanting ions of at least one dopant material into a substrate through a surface of the substrate. The method comprises exposing the surface of the substrate to at least one ion beam of a dopant material, wherein the tilt angle of the ion beam with respect to the surface of the substrate is varied according to a predefined time schedule comprising a plurality of implanting periods. Moreover, the tilt angle is kept within a predefined range during each implanting period.

According to another embodiment, the present invention relates to a method of forming at least one field effect transistor on a semiconductor substrate. The method comprises forming at least one gate structure on an active region of at least one transistor and implanting ions of at least one dopant material through the surface of the substrate into at least the portions of the substrate not covered by the gate structure by exposing the surface of the substrate to at least one ion beam of a dopant material. Moreover, the tilt angle of the ion beam with respect to the surface of the substrate is varied according to a predefined time schedule comprising a plurality of implanting periods, the tilt angle being kept within a predefined range during each implanting period.

According to a further embodiment of the present invention, there is provided a method of forming at least one field effect transistor on a semiconductive substrate. The method comprises forming at least one polysilicon gate structure on an active region of at least one transistor and implanting ions of a first predefined conductive type during a first implantation step into at least the portions of the substrate not covered by the gate structure. Moreover, the method comprises implanting ions of a second predefined conductivity type opposed to the first conductivity type during a second implantation step into at least the portions of the substrate not covered by the gate structure, wherein during one or both of the first and second implantation steps the tilt angle of the ion beam is varied, with respect to the surface of the substrate, according to a predefined time schedule comprising a plurality of implanting periods, and wherein the tilt angle is kept within a predefined range during each implanting step.

BRIEF DESCRIPTION OF THE DRAWINGS

The invention may be understood by reference to the following description taken in conjunction with the accompanying drawings, in which like reference numerals identify like elements, and in which.

Figure 1A:
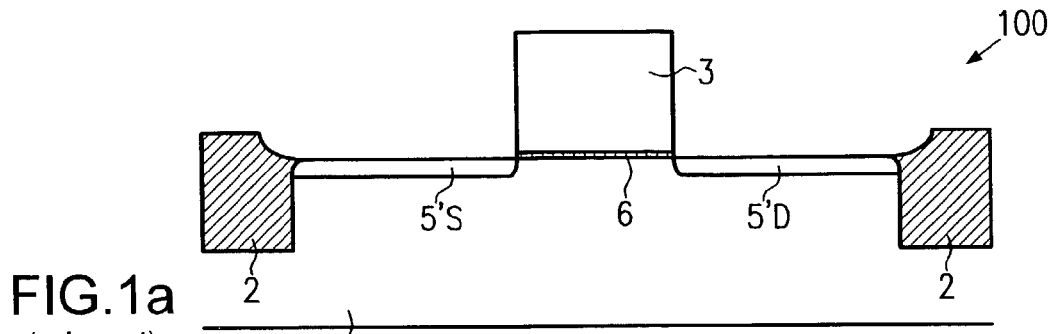
FIGS. 1a-1c represent a typical process sequence of a prior art method of forming the source and drain regions of a field effect transistor comprising the step of implanting halo structures.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is understood to be of particular advantage when used for forming the source and drain regions of field effect transistors. For this reason, examples will be given in the following in which corresponding embodiments of the present invention are applied to the formation of the source and drain regions of a field effect transistor. However, it has to be noted that the use of the present invention is not limited to the formation of the source and drain regions of field effect transistors, but rather the present invention can be used in any other situation in which the realization of doped regions in a substrate and/or a workpiece is required. The present invention can be carried out in all those situations in which doped regions have to be formed, wherein different portions of the regions have to exhibit different dopants to effectively adjust material and/or operational characteristics of the element of interest. The present invention is therefore applicable to these situations and the source and drain regions of a field effect transistor described in the following illustrative embodiments are to represent any such portion and/or region of a substrate.

Figure 2A:
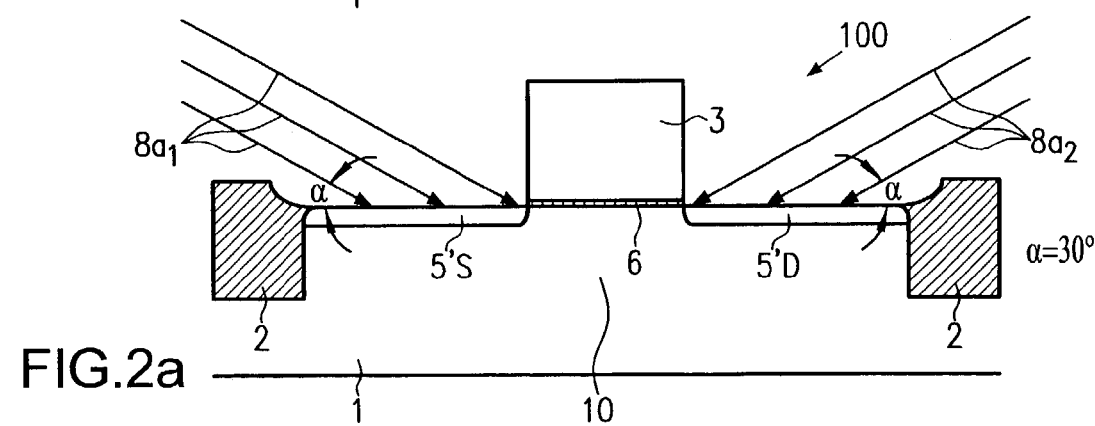
FIGS. 2a-2d represent the implanting of dopants into the active region of a field effect transistor according to an illustrative embodiment of the present invention.

With reference to FIGS. 2a-2d, an illustrative embodiment of the implanting methods of the present invention will now be described. In FIG. 2a, reference 1 relates to a substrate on which a field effect transistor 100 has to be formed, such as, for example, a PMOS, an NMOS or a CMOS transistor. Reference 2 relates to isolation structures defining an active region 10. The isolation structures 2 are provided as shallow trench isolation (STI) structures. However, other isolation structures, for instance LOCOS (local oxidation of silicon) structures could have been formed instead of STI structures. The isolation structures 2 essentially comprise an insulating material, such as silicon dioxide, silicon nitride or the like. Reference 3 relates to a polysilicon gate electrode (in the following also referred to as gate polysilicon line) formed on a gate insulation layer 6 patterned on the active region 10 of the substrate 1. Moreover, in FIG. 2a, references 8a1 and 8a2 relate to corresponding ion beams to which the substrate 1 is exposed for the purpose of implanting dopants into the portions of the substrate 1 not covered by the polysilicon line 3 and the gate insulation layer 6. Finally, in FIG. 2a, references 5'S and 5'D relate to source and drain extension (SDE) regions formed in the substrate 1. The source and drain extension regions 5'S and 5'D contain a light dose of dopants in the exposed portions of the substrate 1. For instance, in the case of a PMOS transistor, a light dose of a P-type dopant material, e.g., boron, is implanted while a light dose of an N-type dopant material, e.g., phosphorous, is implanted in the case of an NMOS transistor.

Figure 2B:
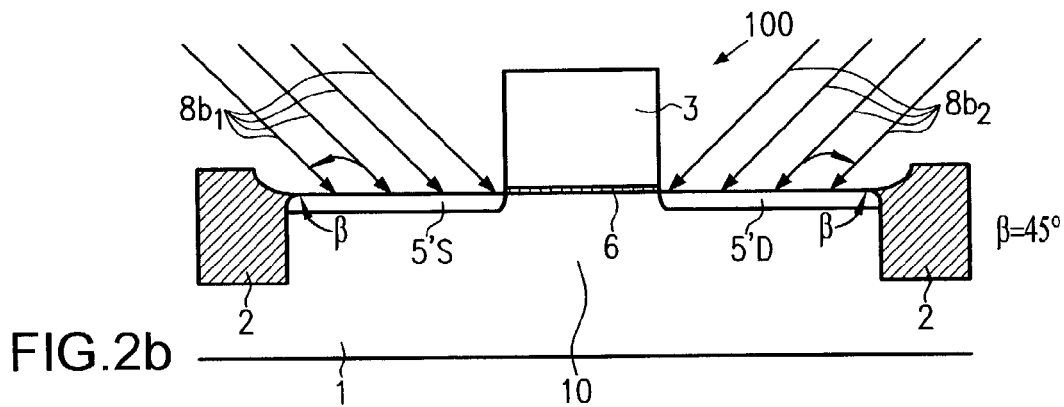
Figure 2C:
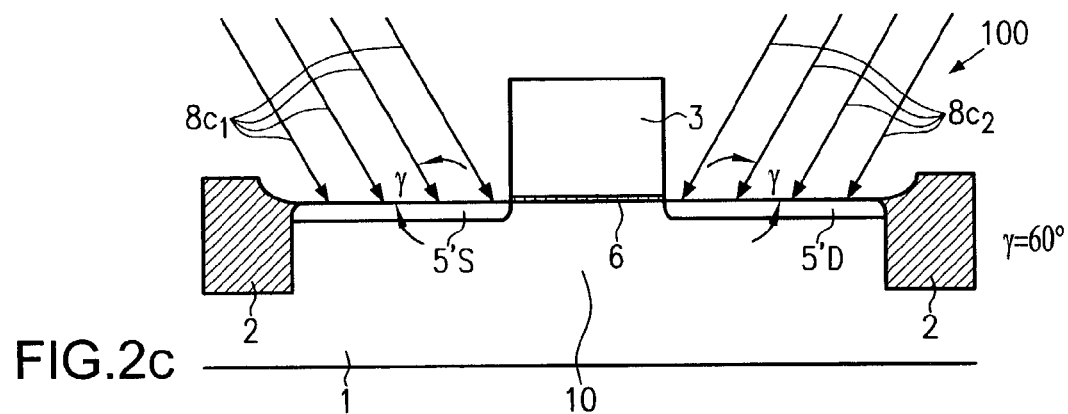
Figure 2D:
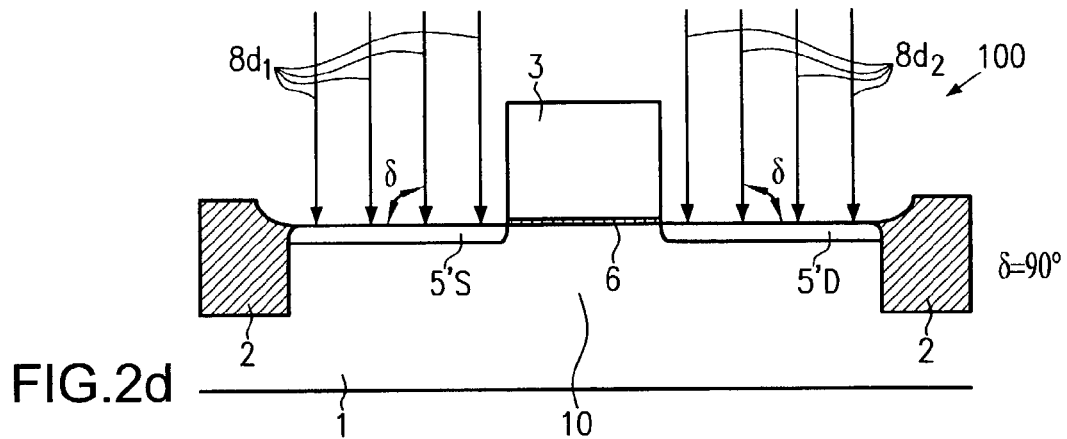

In FIGS. 2b-2d, the features already described with reference to FIG. 2a are identified by the same reference numerals. In FIG. 2b, references 8b1 and 8b2 relate to ion beams to which the substrate 1 is exposed for the purpose of implanting dopants into the substrate 1 according to the method of the present invention. The tilt angle $\beta$ of the ion beams 8b1 and 8b2 with respect to the surface of the substrate 1 differs from the tilt angle $\alpha$ of the ion beams 8a1 and 8a2 of FIG. 2a.

In FIG. 2c, references 8c1 and 8c2 relate to other ion beams, the tilt angle $\gamma$ of these ion beams 8c1 and 8c2 differing from the tilt angles $\alpha$ and $\beta$ of the ion beams 8a1, 8a2 and 8b1, 8b2 of FIGS. 2a and 2b, respectively.

In FIG. 2d, references 8d1 and 8d2 relate to further ion beams having a tilt angle with respect to the surface of the substrate 1 differing from the angles $\alpha$, $\beta$ and $\gamma$ of the ion beams of FIGS. 2a-2c.

The present invention may be advantageously applied to the formation of halo structures of field effect transistors. Therefore, in the following illustrative embodiment, a description is provided for forming halo structures of a field effect transistor.

The manufacturing process for the formation of halo structures starting from the transistor 100 as depicted in FIG. 2a may include the following steps. As apparent from FIG. 2a, a polysilicon gate structure, including the polysilicon line 3 and the gate insulation layer 6 and the source/drain extension regions 5'S and 5'D have been previously formed according to well-known techniques. The formation of the halo structures normally starts after the source/drain extension regions 5'S and 5'D have already been formed. However, the halo structures may be formed first and the implanting step for forming the source/drain extension regions 5'S and 5'D can be carried out next. In the illustrative embodiment depicted in FIGS. 2a-2d, it is assumed that the source and drain extension regions 5'S and 5'D have already been formed and an implanting process is subsequently carried out for the purpose of forming the halo structures of the field-effect transistor 100.

During the implanting process according to the present invention for forming the halo structures of the field effect transistor 100, the tilt angle between the ion beam and the surface of the substrate 1 is not kept constant as in the prior art methods, but is varied during the implanting process according to a predefined time schedule. That is, the implanting process comprises several implanting periods and/or segments of different lengths, and the tilt angle between the ion beam and the surface of the substrate is varied from each segment to the subsequent segment.

By choosing a non-constant timing for the different periods (at different implant angles) of the implant process, each substrate portion receives its optimum dopant concentration to suppress or minimize particular short-channel effects arising in that region.

That is, if a time schedule for the implanting step is selected and the tilt angle, the implanting dose and the implanting energy are opportunely varied according to this time schedule, it becomes possible to realize doped halo structures wherein different regions have different dopant concentrations, allowing one to minimize and/or prevent different short-channel effects. For instance, if the implanting period with a tilt angle of about 90° is prolonged and implanting energy and dose are increased, halo structures are realized extending deeper in the vertical direction so that the vertical source/drain extension penetration depth can be better controlled. On the contrary, if the implanting segment with a small tilt angle is prolonged and the implantation dose and implantation energy are increased, halo structures extending widely in the channel region of the transistor can be realized, thus allowing for the effective reduction of the short-channel effect and the source-drain punch-through.

In the illustrative embodiment depicted in FIGS. 2a-2d, the method of implanting dopants into a substrate according to the present invention comprises four periods or segments depicted respectively in FIGS. 2a, 2b, 2c and 2d. During a first period, the ion beam is kept at the predefined tilt angle $\alpha$ with respect to the surface of the substrate 1; in one particular example, the angle $\alpha$ is about 30°. The tilt angle $\alpha$ may either be kept substantially constant during the first implanting segment or it may be kept within a predefined range. That is, the angle $\alpha$ may be varied extremely slowly, say from 29.5° to 30.5° so that an effective dopant concentration substantially corresponds to a tilt angle of 30°. During the first implanting segment, both the implanting dose and the implanting energy can be predefined depending on the result to be achieved and the final concentration profile to be obtained. For instance, if halo structures have to be formed to extend far beyond the edges of the gate structure, e.g., extending deep into the channel region under the gate insulating layer 6, a high implanting dose and implanting energy may be selected during the implanting period in which the tilt angle $\alpha$ is kept at approximately 30° or less. The first implanting process may comprise two semi-periods, wherein the substrate is rotated 180° about an axis perpendicular to the surface at the end of the first semi-period and upon entering the second semi-period.

In this case, the substrate is exposed to the same ion beam during the first and second semi-periods, and the ion beams 8a1 and 8a2 simply indicate that the substrate has been rotated 180°. Alternatively, the orientation of the ion beam can be modified, for instance by rotating the ion beam source, so as to expose the substrate to two ion beams 8a1 and 8a2 during the first and second semi-periods, with both ion beams 8a1 and 8a2 forming the same tilt angle with respect to the surface of the substrate 1.

The implanting process is then continued by varying the tilt angle and implanting dopants during a second implanting segment as depicted in FIG. 2b. In one particular example, the tilt angle $\beta$ is selected to be about 45°. Again, during the second period, the tilt angle $\beta$ can either be kept constant or kept within a predefined range. Moreover, the length of the second period may either differ from the length of the first period or may correspond to the length of the first period. Furthermore, during the second period, the implanting dose and energy are also selected depending on the final concentration profile to be obtained. One or both of the implanting dose and energy may either differ or correspond to the implanting dose and energy selected during the first implanting period. In the same way as in the case of the first period, the second implanting period may be divided into two semi-periods, each of which has a length corresponding to half the total length of the period, wherein the substrate 1 being is rotated 180° about an axis perpendicular to its surface at the end of the first semi-period. In this case, references 8b1 and 8b2 in FIG. 2b indicate the beams to which the substrate is exposed upon entering the second semi-period. Alternatively, the substrate 1 may be exposed to two ion beams 8b1 and 8b2 during the first and second semi-period, respectively, the ion beams 8b1 and 8b2 forming the same tilt angle $\beta$.

The implanting process is then continued with a third tilt angle $\gamma$ of about 60°, or a preselected range thereabout, for the ion beams 8c1 and 8c2, as depicted in FIG. 2c. In the same way as in the case of the first two periods, the third period may also be divided into semi-periods, with either the substrate 1 being rotated approximately 180° during the second semi-period or the rotation of the ion beam being modified. The total length of the third period may correspond to one or both of the lengths of the first and second periods; alternatively, the total length of the third period may differ from the length of the first and second periods.

The implanting dose and energy during the third period are predefined and may correspond to or differ from the implanting dose and energy preselected for one or both of the first and second periods.

During a final implanting period, as depicted in FIG. 2d, the implanting process is carried out with a preselected tilt angle $\delta$ of about 90°. Again, during this last implanting period that may also comprise two semi-periods, the implanting dose and energy are selected as a function of the final concentration profile to be obtained. The tilt angle $\delta$ is either constant or is kept within a predefined range. The substrate 1 is rotated 180° at the end of the first semi-period and at the beginning of the second semi-period, with the ion beams 8d1 and 8d2 of FIG. 2d indicating that the substrate 1 is rotated. Alternatively, the substrate may be exposed to two ion beams 8d1 and 8d2 that are differently oriented but that form a same tilt angle $\delta$ with respect to the surface of the substrate.

At the end of the implanting process, as depicted with reference to FIGS. 2a-2d, a thermal treatment is normally carried out to allow the implanted dopants to diffuse into the substrate. The temperature and the length of this thermal treatment are also selected as a function of the final concentration to be obtained.

Figure 3A:
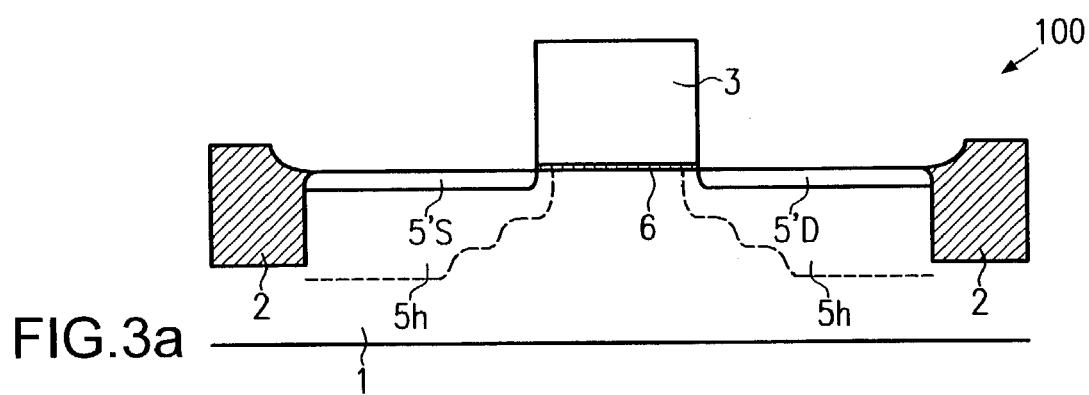
FIGS. 3a-3b show corresponding examples of halo structures realized by implanting dopants according to illustrative embodiments of the present invention.
Figure 3B:
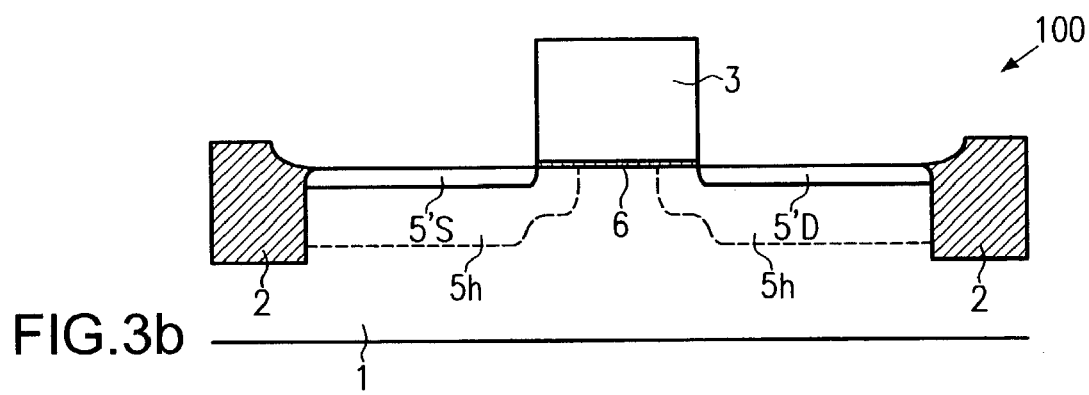

In FIGS. 3a-3b, two examples are depicted showing halo structures 5h realized by implanting dopants into the source and drain regions of a field effect transistor 100 according to the present invention. As is apparent from FIG. 3a, halo structures 5h depicted therein extend considerably in the vertical direction and less into the channel region of the field effect transistor 100. This means that dopants have been implanted according to a time schedule wherein the periods with tilt angles approximating 90° are predominant, i.e., these periods are longer than the periods with small tilt angles, for example, 30° and less. The implanting dose and energy during the implanting periods with tilt angles approximating 90° are selected to be larger than the implanting dose and energy during the implanting periods with small tilt angles.

In FIG. 3b, another example of halo structures 5h is depicted that have been formed according to the implanting process of the present invention. The halo structures of FIG. 3b extend considerably into the channel portion of the transistor 100 and less in the vertical direction. This means that ions have been implanted at small tilt angles during longer periods and with relatively high implanting dose and energy.

Although the illustrative embodiment of the present invention as described with reference to FIGS. 2a-2d contains four implanting periods, it has to be noted that any number of implanting periods can be used without departing from the scope of the present invention. For instance, two to ten periods or more can be provided, for example, at different implant angles, depending on the final dopant concentration to be obtained in the substrate 1.

It is also to be noted that the implanting process does not need to be interrupted when the tilt angle is varied according to the predefined time schedule, but can be continued while the tilt angle is changed from an implanting period to the next.

Once the halo structures 5h have been formed as described above, the manufacturing process is continued according to well-known techniques for completing the transistor 100. Typically, once the halo structures 5h have been formed, a heavy implantation step (not depicted in the figures) is carried out for forming the source and drain regions 5S and 5D of the transistor 100.

The advantage of forming halo structures according to the implanting process of the present invention is based on the fact that each device region receives its optimum dopant quantity to appropriately adjust material and/or functional properties. This is accomplished by predefining a particular time schedule and varying the tilt angle of the ion beam according to the time schedule. Depending on the circumstances, the implanting dose and the implanting energy can also be varied according to the predefined time schedule.

Figure 1B:
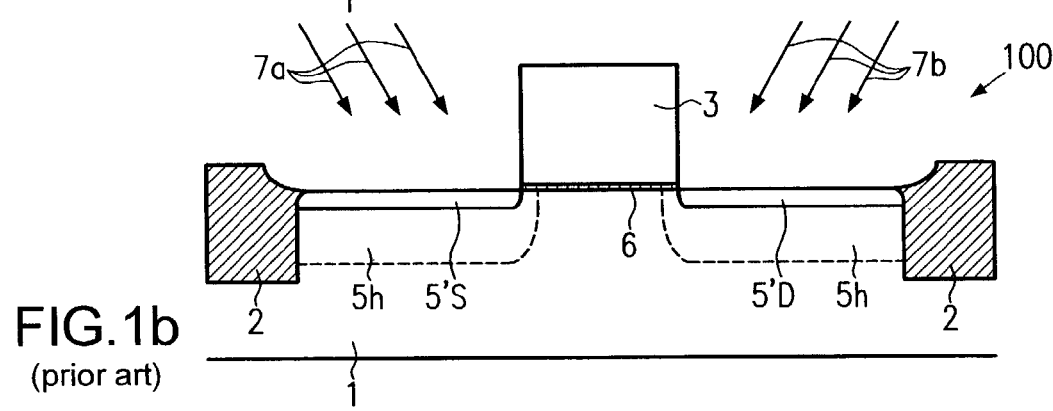
Figure 1C:
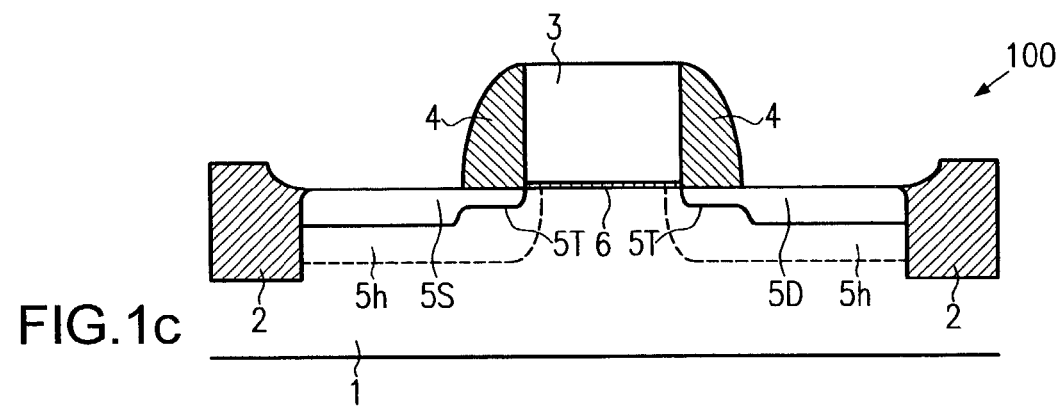

Contrary to the conventional process flow as described with reference to FIG. 1a-1c, the present invention allows the formation of a required dopant profile by means of a single implant process. For instance, conventionally a single implant may improve device characteristics with respect to a single adverse effect, for example the punch-through. Thus, for controlling other effects, such as the vertical penetration depth of the source-drain extension regions, a plurality of implant steps may be necessary, thereby adding process time and deteriorating tool utilization. For instance, it may be required to carry out three implants, e.g., for suppressing punch-through, and controlling the vertical dopant profile by a first, shallow and a second, deep halo implant.

According to the embodiments described above, however, a single implant process may be performed, thereby providing an even superior result in that the transition between the different implant regions is more continuous or smoother. This smooth transition leads to a reduced parasitic junction capacitance and thus enhanced AC performance of the transistor.

In other embodiments, the implants required for superior device characteristics may be carried out as individual processes, for example, when an implant energy and/or an implant dose may not readily be changed during the operation of an implant tool, whereas each implant includes a plurality of implant angles to obtain a desired smooth transition between the different implant regions created by the individual processes.

In one embodiment, a shallow surface implant may be performed with boron at approximately 3-9 keV and approximately 30-65 keV for arsenic at a dose of approximately $3-7 \times 10^{13}$ atoms/cm² for both. The tilt angle may continuously be varied in a range of approximately 35-45°. A punch-through-suppression implant may be carried out at approximately 5-11 keV with boron and approximately 40-80 keV for arsenic at a dose of approximately $5 \times 10^{12}$ to $1 \times 10^{13}$ atoms/cm² for both, wherein the tilt angle may continuously be varied between approximately 20-35°. Boron and arsenic may be used for NMOS and PMOS transistors, respectively.

The present invention allows the implanting of any dopant. For example, dopants of inverse conductivity may be implanted. For instance, in the case of NMOS transistors, P-type ions are implanted for the purpose of forming the halo structures. For instance, boron ions may be implanted to this end. When halo structures of PMOS transistors have to be formed, N-type ions are implanted, for instance comprising phosphorous.

It also has to be noted that the present invention is not limited to the formation of halo structures, but can be used in all those cases in which the formation of implanted regions is required in a substrate exhibiting a predefined concentration profile. For instance, the present invention can be carried out to form the source/drain extension regions as well as the source and drain of field effect transistors.

The present invention does not need special equipment to be provided, but can be implemented in any usual manufacturing process without adding cost or complexity.

The way the tilt angle is varied during the implanting process can be selected depending on the circumstances. For instance, the tilt angle can be varied by rotating the ion source or by rotating the target, i.e., the substrate, about a predefined axis.

Figure 4A:
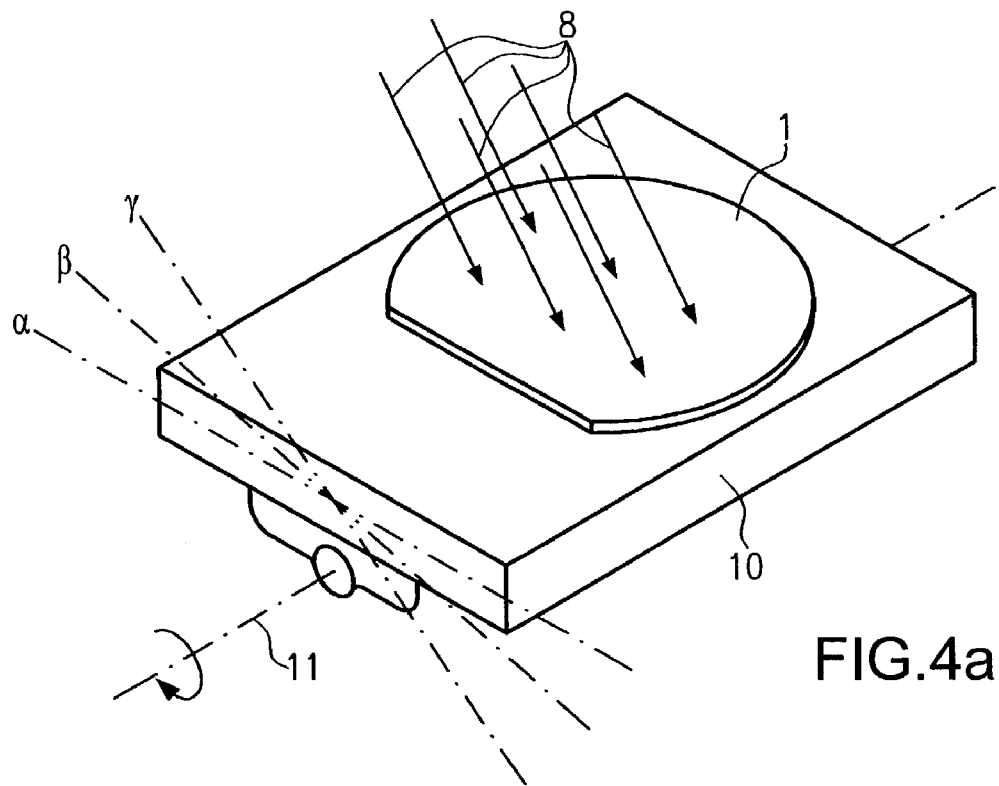
FIGS. 4a-4b represent corresponding examples of implanting apparatuses suitable for carrying out the implanting techniques illustrated in FIGS. 2a-2d and FIGS. 3a-3b.

In FIG. 4a, an example is depicted in which a substrate 1 is placed on a support 10 which is adapted to be rotated about a predefined axis 11 so that several tilt angles α, β and γ can be obtained.

Figure 4B:
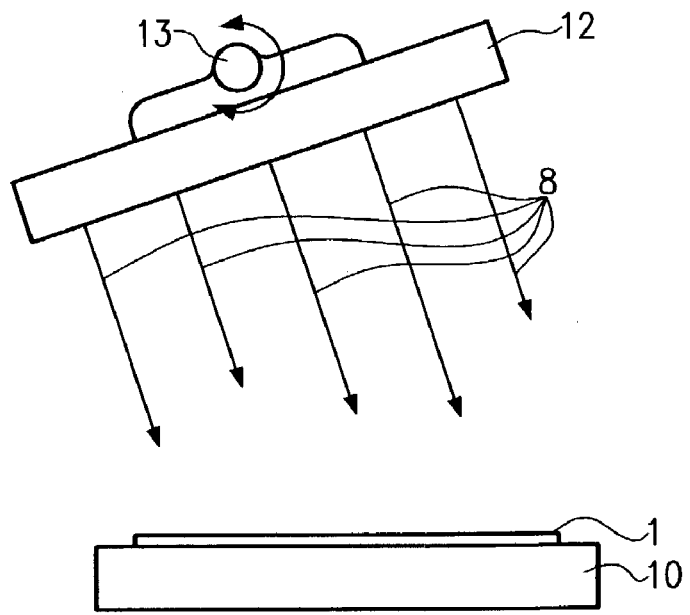

In the example given in FIG. 4b of a piece of ion implantation equipment, the substrate 1 is placed on a fixed support 10 and the ion source 12 is adapted to be rotated about an axis 13 (perpendicular to the plane of the figure) so that different tilt angles between an emitted beam 8 and the surface of the substrate 1 can be obtained.

Of course, equipment can be provided featuring both a rotatable support 10 as depicted in FIG. 4a and a rotatable ion source as depicted in FIG. 4b.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of implanting ions of at least one dopant material into a substrate through a surface of the substrate to form halo implant regions in said substrate, the method comprising:
    exposing the surface of said substrate to at least one ion beam of said at least one dopant material;
    wherein a tilt angle of the ion beam with respect to the surface of said substrate is varied according to a predefined time schedule comprising a plurality of implanting periods, said tilt angle being different in each of said plurality of implanting periods; and
    wherein during each implanting period the tilt angle is kept within a predefined range.

2. The method of claim 1, wherein the implanting periods have different lengths.

3. The method of claim 1, wherein the tilt angle is kept constant during each implanting period.

4. The method of claim 1, wherein the implanting energy is varied according to the predefined time schedule, and wherein during each implanting period the implanting energy is kept within a predefined range.

5. The method of claim 4, wherein the implanting energy is kept constant during each implanting period.

6. The method of claim 1, wherein the implanting dose is varied according to the predefined time schedule, and wherein during each implanting period the implanting dose is kept within a predefined range.

7. The method of claim 6, wherein the implanting dose is kept constant during each implanting period.

8. The method of claim 1, wherein the substrate contains at least one semiconductive material.

9. The method of 1, wherein the at least one dopant material comprises one of phosphorous and boron.

* * * * *